United States Patent
Ono

(10) Patent No.: US 7,768,279 B2
(45) Date of Patent: Aug. 3, 2010

(54) CONTROL METHOD AND CONTROL PROGRAM FOR PROBER

(75) Inventor: Yasukazu Ono, Kasugai (JP)

(73) Assignee: Fujitsu Semiconductor Limited, Yokohama (JP)

(*) Notice: Subject to any disclaimer, the term of this patent is extended or adjusted under 35 U.S.C. 154(b) by 0 days.

(21) Appl. No.: 11/812,648

(22) Filed: Jun. 20, 2007

(65) Prior Publication Data

US 2007/0296430 A1    Dec. 27, 2007

(30) Foreign Application Priority Data

Jun. 27, 2006   (JP)   .............................. 2006-177015

(51) Int. Cl.
*G01R 31/02*   (2006.01)

(52) U.S. Cl. ...................... 324/754; 324/73.1

(58) Field of Classification Search ......... 324/750–765, 324/158.1; 438/14, 17; 439/632; 257/777
See application file for complete search history.

(56) References Cited

U.S. PATENT DOCUMENTS

| | | | | |
|---|---|---|---|---|
| 5,444,386 A | * | 8/1995 | Mizumura | 324/754 |
| 6,037,793 A | * | 3/2000 | Miyazawa et al. | 324/760 |
| 6,097,240 A | * | 8/2000 | Lapushin | 327/513 |
| 6,137,303 A | * | 10/2000 | Deckert et al. | 324/765 |
| 6,545,458 B2 | * | 4/2003 | Yamazaki | 324/158.1 |
| 2002/0011835 A1 | * | 1/2002 | Yamazaki | 324/158.1 |
| 2003/0179007 A1 | * | 9/2003 | Nozoe et al. | 324/754 |

FOREIGN PATENT DOCUMENTS

| | | |
|---|---|---|
| CN | 1739194 | 2/2006 |
| EP | 1617468 | 1/2006 |
| JP | 54-004078 | 1/1979 |
| JP | 04-354345 | 12/1992 |
| JP | 6-112286 A | 4/1994 |
| KR | 2001-0092087 | 10/2001 |

OTHER PUBLICATIONS

SIPO Office Action dated Sep. 26, 2008 in Chinese Pat. App. No. 20070112456.7.
KIPO Office Action dated Oct. 21, 2008 in Korean Pat. App. No. 10-2007-0063054.

* cited by examiner

*Primary Examiner*—Minh N Tang
*Assistant Examiner*—Trung Q Nguyen
(74) *Attorney, Agent, or Firm*—Fujitsu Patent Center

(57) ABSTRACT

To provide a control method and a control program of a prober that are capable of enhancing throughput. Chips are tested in step S2. In step S3, when the counted number Y of conforming chips has reached a predetermined number of conforming chips X which constitutes conditions for testing, the process advances to step S10. In step S10, testing of wafers taking place at that time is interrupted, and this wafer is stored in an output cassette OC1. In a subsequent step S11, the subsequent wafer is tested, and stored in the output cassette OC2 (step S12). When all wafers have been tested, the process advances to step S14, and testing of the lot is completed. As a result, wafers that remain untested and wafers that have been tested stored separately in the input cassette and the output cassettes.

10 Claims, 4 Drawing Sheets

FIG. 1   SCHEMATIC DIAGRAM OF PROBER 1

OPERATION FLOWCHART OF PROBER 1 IN SECOND EMBODIMENT

FIG. 4    (PRIOR ART)
BLOCK DIAGRAM OF BACKGROUND ART
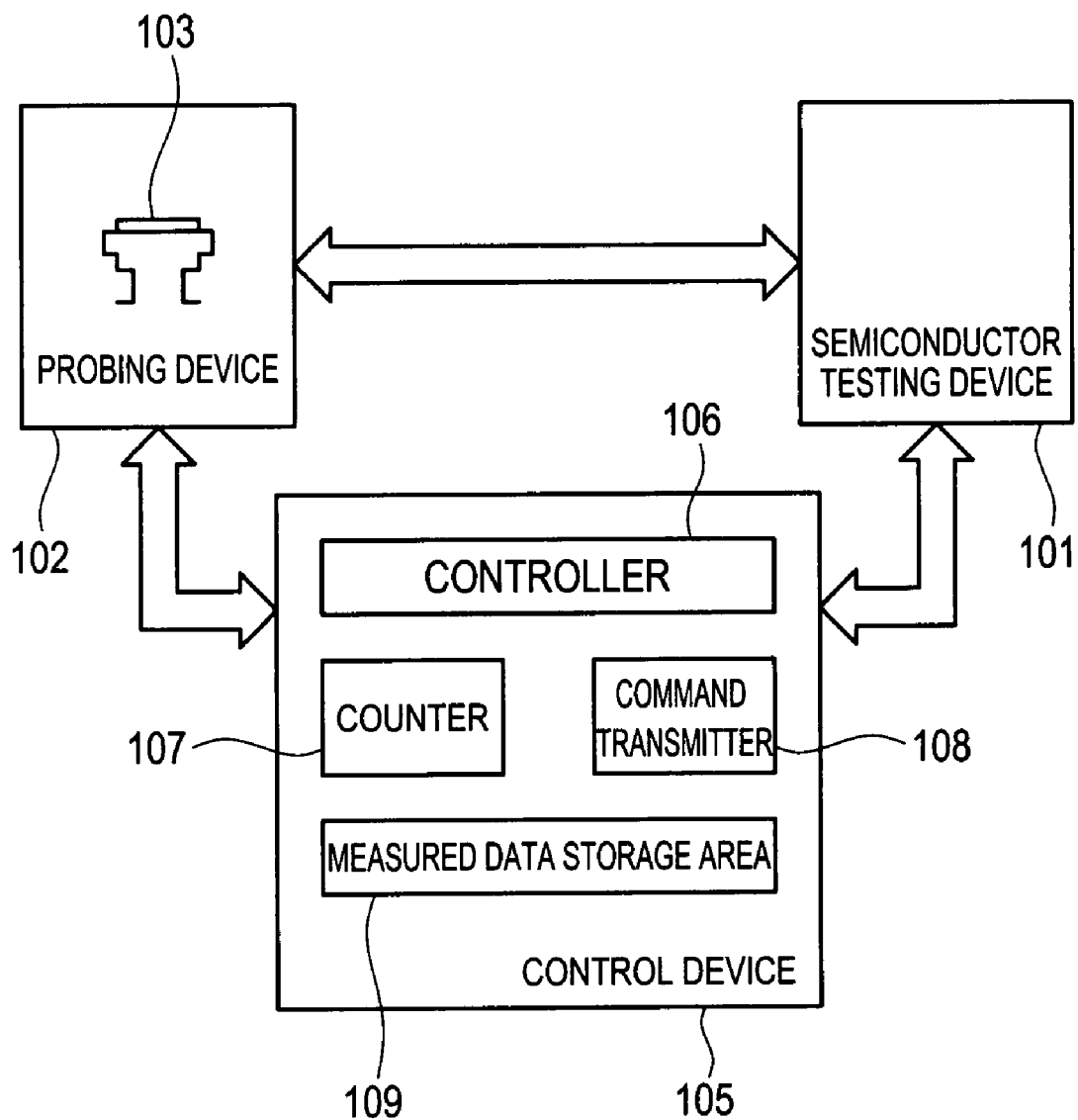

CONTROL METHOD AND CONTROL PROGRAM FOR PROBER

CROSS-REFERENCE TO RELATED APPLICATIONS

This application is based upon and claims the benefit of priority from the prior Japanese Patent Application No. 2006-177015 filed on Jun. 27, 2006, the entire contents of which are incorporated herein by reference.

BACKGROUND OF THE INVENTION

1. Field of the Invention

It is related to a prober for testing semiconductor wafers, and more particularly to a control method and a control program for a prober that are capable of enhancing throughput.

2. Description of the Related Art

FIG. 4 is a block diagram disclosed in Japanese Unexamined Patent Publication No. 4 (1992) -354345. Electric characteristics of pellets (chips) in a wafer 103 are measured by a semiconductor testing device 101, and when all tests on one wafer has been completed, a control device 105 reads the yield of the wafer 103 from a probing device 102, and the number of wafers of which the yield is less than a specified standard is counted by a counter 107. When the counted number reaches a predetermined number, a controller 106 sends from a command transmitter 108 a measured data output request command to the semiconductor testing device 101. The measured data sent from the semiconductor testing device 101 is put into a measured data storage area 109, and when the collection of data of a predetermined number of wafers has been completed, the controller 106 issues a stop signal to the probing device 102 so as to stop probing.

Related technology is disclosed in Japanese Unexamined Patent Publication No. 54 (1979) -004078.

In the measurement of shipping tests of mass-produced items, a plurality of (usually 25) wafers are usually packed into a cassette and stored as one lot, and the wafers are tested in units of one lot. However, wafers are not necessarily always tested in units of a lot. When chips that have passed a test reach a predetermined number, the wafers are divided, and proceed to a subsequent process. In such a case, a lot may on occasions need to be divided on the basis of the test results of testing.

For example, when dividing a lot after testing, wafers that make up one lot are set in the cassette, and when the number of chips passing the test reach a predetermined number, the test is interrupted, the cassette is taken out of the prober, and the lot divided. In such circumstances, in order to continue testing on the remaining wafers, the cassette in which the remaining wafers are stored must be set in the prober again. The process of setting again and then aligning, the wafers takes place and the level of throughput may be lowered.

Further, when, for example, a lot is divided before testing is commenced, it is essential to predict the yield and to prepare a number of wafers that is considered sufficient for purposes of obtaining chips that will pass the test. However, if the yield is higher than predicted, an unnecessary measurement is performed. If, on the other hand, the yield is lower than predicted, additional wafers need to be added to the lot, and the process of removing the cassette and setting it again takes time. In either event, efficiency in terms of time is poor and the level of throughput is lowered.

SUMMARY OF THE INVENTION

In the light of such background art it is an object thereof to provide a control method and a control program for a prober that is capable of enhancing throughput, by eliminating time required for setting the wafer cassette a second time, or for aligning it a second time.

In order to achieve the above object, there is provided a control method for a prober that tests a plurality of semiconductor devices manufactured on a semiconductor wafer, comprising: a step of taking out from a first storage unit in which a plurality of semiconductor wafers that are to be tested is stored the semiconductor wafer that is subject to testing, and testing the semiconductor devices on the semiconductor wafers sequentially, and a step of storing in a second storage unit the semiconductor wafers that have been tested, wherein the testing step and storing step are repeated.

In order to achieve the object, there is also provided a control program for a prober for testing a plurality of semiconductor devices manufactured on a semiconductor wafer, comprising: a step of taking out from a first storage unit in which a plurality of semiconductor wafers that are to be tested is stored the semiconductor wafer that is subject to testing, and testing the semiconductor devices on the semiconductor wafers sequentially, and a step of storing in a second storage unit the semiconductor wafers that have been tested, wherein the step of testing and the step of storing are repeated.

On a semiconductor wafer, a plurality of semiconductor devices are manufactured. A step for testing is to take out from a first storage unit in which a plurality of semiconductor wafers that are to be tested are stored semiconductor wafers that are subject to testing. Electric characteristics are tested sequentially on semiconductor devices on the semiconductor wafers that are taken out. A step for storing is to store in a second storage unit semiconductor wafers that have been tested. The step for testing and storing are repeated until all semiconductor wafers in the first storage unit have been tested and transferred to the second storage unit. Incidentally, semiconductor wafers that are subject to be tested do not include only the semiconductor wafers that have never been tested, but, needless to say, may also include semiconductor wafers that have once been tested unsuccessfully but need to be tested a second time.

By means of the prober, the semiconductor wafers that have been tested are stored in the second storage unit, and new semiconductor wafers are stored in the first storage unit. In other words, semiconductor wafers that have been tested and semiconductor wafers that are to be tested can be physically separated.

Conventionally, semiconductor wafers that have been tested and semiconductor wafers that are to be tested have been stored in the same storage unit. In these circumstances, while the semiconductor wafers were being tested and, when the intention was to take out semiconductor wafers by separating semiconductor wafers that had been tested from semiconductor wafers that were yet to be tested, it has been necessary to take out the storage unit from the prober, and to then separate the semiconductor wafers. Accordingly, in order to continue testing on new semiconductor wafers, the storage unit in which the remaining semiconductor wafers were stored had to be set again on the prober. Time had to be taken for setting the storage unit once again, and for aligning it once again, and this led to a lowering in the level of throughput is lowered.

New semiconductor wafers and semiconductor wafers that have been tested are stored separately, in the first storage unit and the second storage unit, respectively. Accordingly, by taking out the second storage unit from the prober, it becomes possible to separate semiconductor wafers that have been tested from semiconductor wafers that are yet to be tested and to take out those that have been tested. The first storage unit not need to be taken out from the prober, and it becomes possible for the remaining semiconductor wafers to be tested continuously. Accordingly, when semiconductor wafers that have been tested are separated from semiconductor wafers that are yet to be tested and then taken out in advance, repetition of the setting and alignment of the storage unit is not necessary, and the level of throughput can be enhanced.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

BRIEF DESCRIPTION OF THE DRAWINGS

FIG. 4 is a block diagram of background art.

DETAILED DESCRIPTION OF THE PREFERRED EMBODIMENTS

Figure 1:
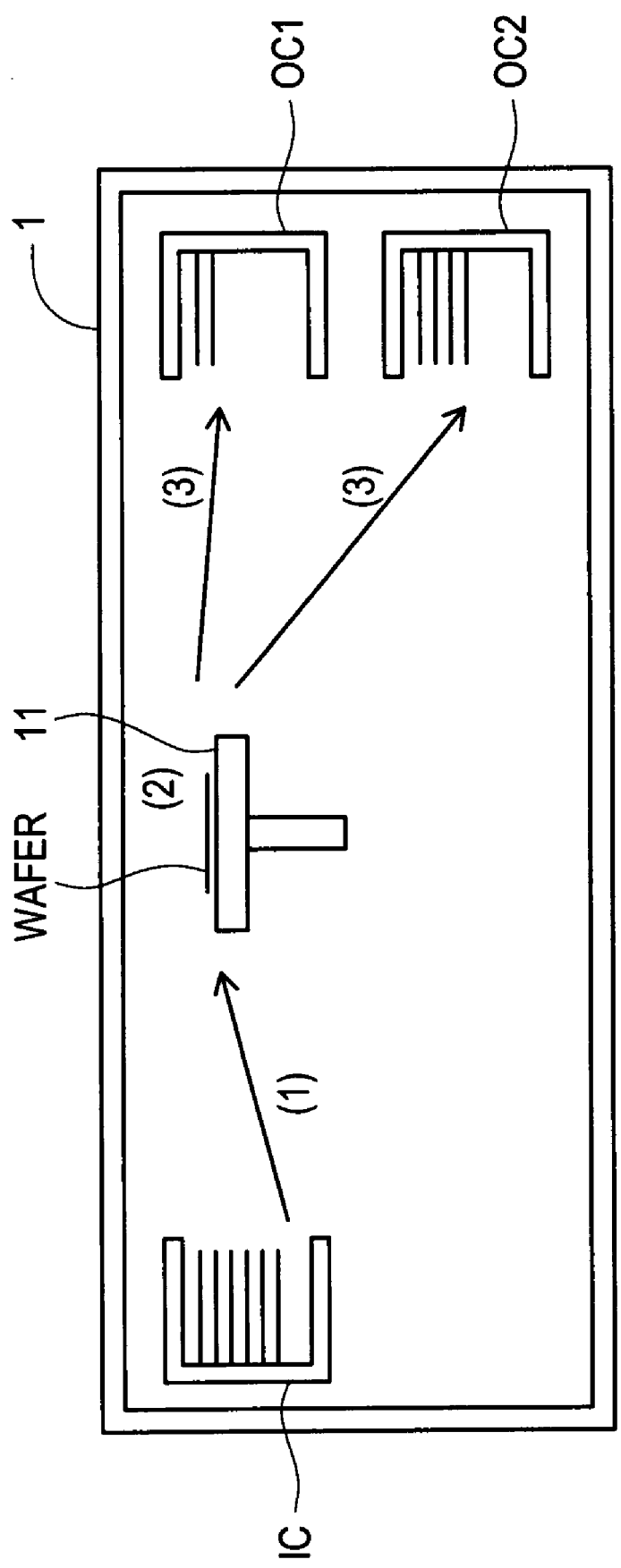
FIG. 1 is a schematic diagram of a prober 1.
Figure 2:
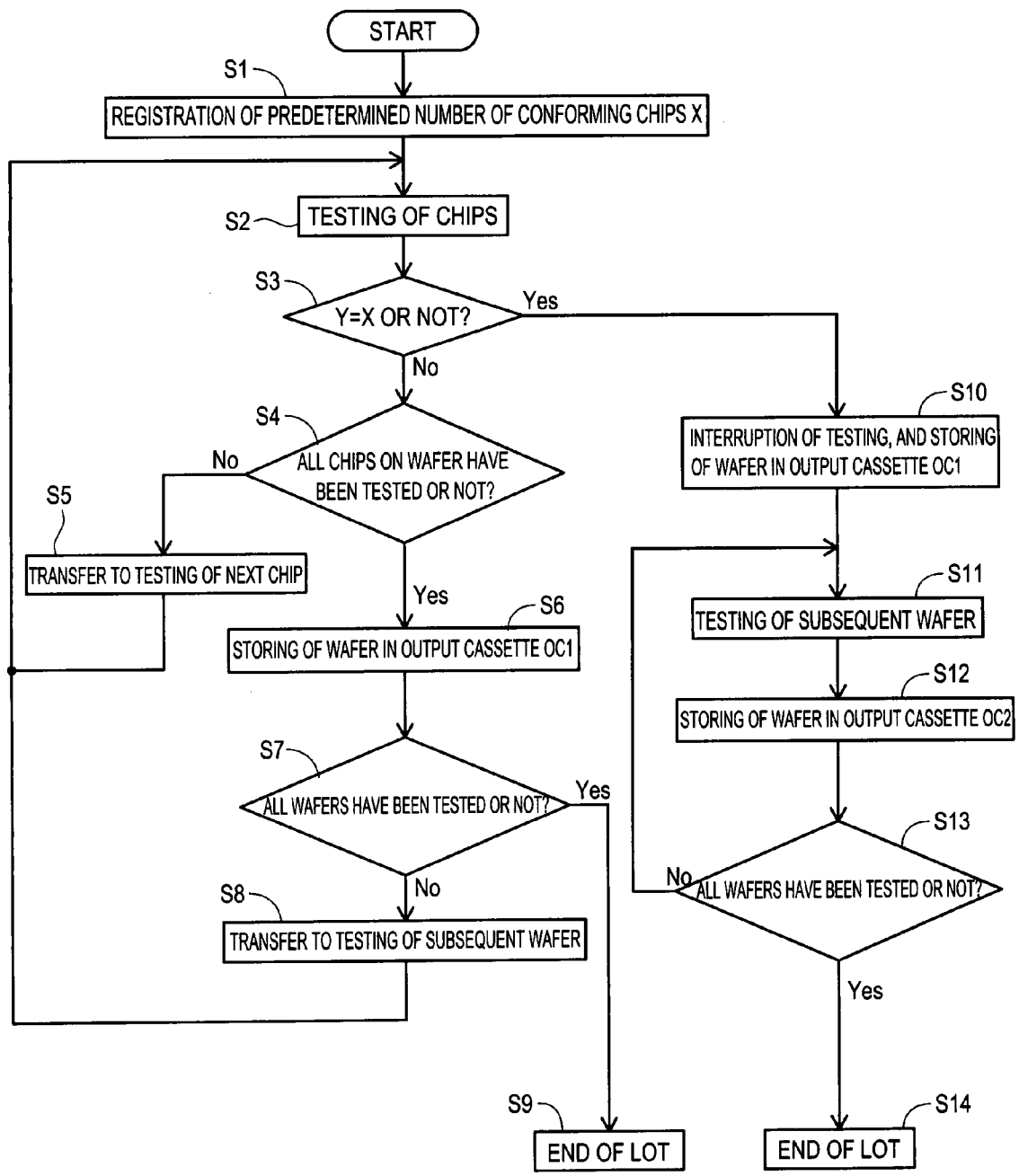
FIG. 2 is an operation flowchart of the prober 1 in a first embodiment.
Figure 3:
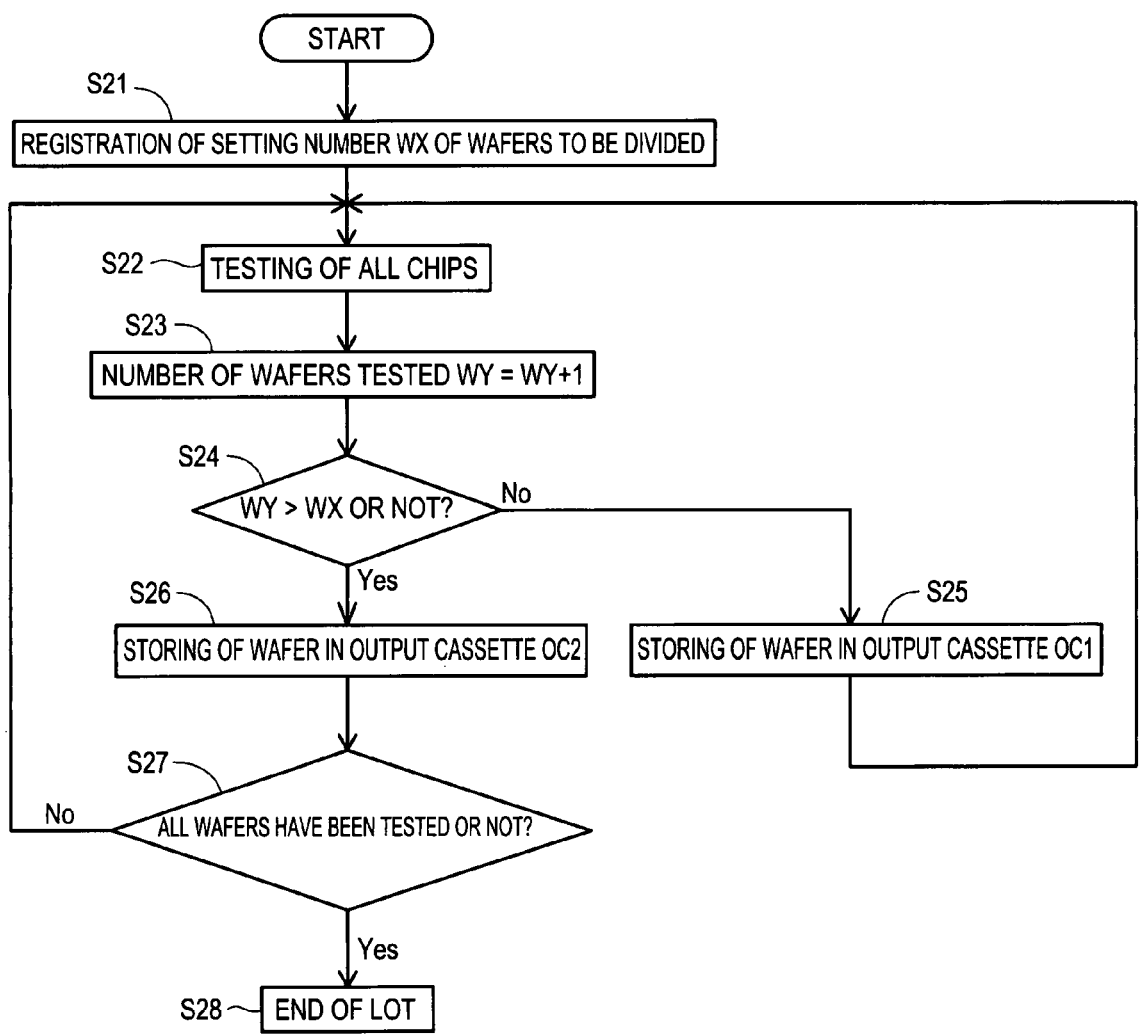
FIG. 3 is an operation flowchart of the prober 1 in a second embodiment.

A control method for the prober of the invention will now be specifically described with reference to FIG. 1 to FIG. 3 illustrating exemplary embodiments. A first embodiment is illustrated in FIG. 1 and FIG. 2. FIG. 1 is a schematic diagram of the prober 1 of the invention. A prober 1 is a device for testing semiconductor wafers electrically. The prober 1 comprises an input cassette IC, output cassettes OC1 and OC2, and a testing stage 11. The input cassette IC, and output cassettes OC1 and OC2 perform a function of storing one lot of (25) wafers by means of overlaying at equal intervals. The input cassette IC stores a wafer before testing, and the output cassettes OC1 and OC2 store wafers after testing, and it goes without saying that it is possible to use only one output cassette. Wafers that have yet to be tested and that are stored in the input cassette IC need not be limited to semiconductor wafers that have never once been tested, but may also include semiconductor wafers that have once been tested unsuccessfully, and have yet to be tested a second time.

An arm (not shown) in the prober picks up wafers from the input cassette IC, one by one and transfers them onto the testing stage 11 (arrow (1) in FIG. 1). Each semiconductor chip that has been formed on the wafer is tested by means of probing ((2) in FIG. 1). When testing has been completed, wafers that have been tested and placed by the arm to the output cassette OC1 or OC2 (arrow (3) in FIG. 1). Similarly, the processes from (1) to (3) are repeated as many times as the number of wafers that are stored in the input cassette IC. The completion of the testing of all 25 wafers means that the testing of one lot has been completed.

Operations of the prober 1 will now be specifically described with reference to the flowchart in FIG. 2. To prepare for testing, an arbitrary number of wafers are put into the input cassette IC, and set in the prober 1. In this embodiment, 25 wafers are stored in the input cassette IC. After the setting of the input cassette IC into the prober 1, alignment and temperature setting are performed. Preparations vary somewhat depending on factors such as the temperature, but in any event require a long period of time, and may on occasions take about 2 hours.

In step S1, a predetermined number of conforming chips X is registered in advance in the memory of the controller (not shown) of the prober 1 as a condition of testing. The number of predetermined conforming chips X can be set at an arbitrary value. In the embodiment, for example, the number of predetermined conforming chips X is 1000. On the assumption that the number of effective chips CE per wafer is 500, that the number of wafers to be tested is 25, and that the yield is 80%, the method of testing all chips on the wafer will now be explained chip by chip.

When testing is indicated, the counted number Y of conforming chips is initialized at 0, and the wafer number WN and chip number CN are set to 1. Testing is started from the first chip of the first wafer.

In step S2, the chip is tested. When a chip is a conforming chip, and has passed the test, the counted number Y of conforming chips is incremented by one (Y=Y+1). If, on the other hand, a chip is defective and has failed the test, the counted number Y of conforming chips remains unchanged (Y=Y).

When testing of a chip has been completed, the process proceeds to step S3, and a judgment is made as to whether or not the counted number Y of conforming chips has reached a predetermined number of conforming chips X that constitutes a condition for the testing. When the predetermined number of conforming chips X is smaller than the counted number Y of conforming chips, a judgment is made that such a condition has still not been satisfied (No at step S3), the process proceeds to step S4, and testing continues. If, in contrast, the counted number Y of conforming chips is equal to the predetermined number of conforming chips X, a judgment is made that the results of testing satisfy the conditions for testing, and the process advances to step S10.

In step S4, a judgment is made as to whether or not all chips on a wafer has been tested. If a chip number CN<number of effective chips CE, a judgment is made to the effect that all chips on the wafer have still not been tested (No at step S4). Accordingly, the process progresses to step S5, the chip number CN is incremented by one (CN=CN+1), the process returns to step S2, and the subsequent chip is tested.

On the other hand, in step S4, in circumstances where the chip number CN=the number of effective chips CE, a judgment is made that testing of all chips on the wafer has been completed (Yes at step S4). Testing of wafers is thereby finished, and a wafer map illustrating the results of testing all chips on the wafer is compiled. The process advances to step S6, the wafers that have been tested are stored in the output cassette OC1, and the process progresses to step S7.

In step S7, a judgment is made as to whether or not wafers that have been stored in the input cassette IC have been tested. If the value of wafer number WN is less than 25 (No at step S7), a judgment is made that all wafers have still not been tested, and the process progresses to step S8. In step S8, the wafer number WN is incremented by one (WN=WN+1), the process returns to step S2, and the subsequent wafer is tested. On the other hand, when the value of the wafer number WN is 25 (Yes at step S7), a judgment is made that testing of all wafers has been completed, the process progresses to step S9, and testing of the lot is completed. In such circumstances, the lot is not divided.

On the other hand, in step S3, when the counted number Y of conforming chips reaches 1000, the results of testing satisfy the conditions of testing, and the process progresses to step S10. In this embodiment, since the number of effective chips CE is assumed to be 500, and the yield to be 80%, 400 conforming chips are obtained per wafer. Hence, in the midst of the testing of the third wafer, the counted number Y of conforming chips reaches 1000, and the process advances to step S10.

In step S10, the testing of the third wafer is interrupted. The third wafer that has been interrupted is stored in the output cassette OC1. As a result, in the embodiment, the first and second wafers testing of which has been completed (a total of 800 conforming chips), and the third wafer that has been interrupted (containing 200 conforming chips) are stored in the output cassette OC1.

With regard to the third wafer that has been stored in the output cassette OC1, a wafer map illustrating the results of testing is compiled. The third wafer includes chips that have still not been tested, and as dummy data, test results of rejection are assigned to the chips that remain untested. Moreover, a wafer map of the first to third wafers is issued as data for purposes of dividing the lot.

The output cassette OC1 is taken out from the prober 1, and sent to the subsequent process together with data for purposes of dividing the lot. In the next process, each chip is evaluated by means of the data for purposes of dividing the lot and a differentiation performed. In the case of chips that remain untested, since results of testing indicating rejection have been assigned as dummy data, they are recognized to be defective. In this way chips that remain untested are prevented from being handled as conforming chips.

In this context, if only one output cassette exists, it is essential that this output cassette always be set in the prober 1 for wafers that have been tested. Further, while the output cassette has been removed from the prober 1, there is no storage destination for wafers that have been tested, and the testing of wafers needs to be suspended. However, in the embodiment two output cassettes are provided, that is, output cassettes OC1 and OC2. Accordingly, on the basis of the results of testing, the storage destination for wafers that have been tested can be changed over from output cassette OC1 to OC2. Accordingly, after a changeover of output cassettes has taken place, even when the output cassette OC1 is removed from the prober 1, wafer testing need not be suspended. As a result, the throughput of the prober 1 can be enhanced.

When the third wafer has been stored in the output cassette OC1, the process of advances to step S11, and testing of the subsequent wafer, that is, the fourth wafer is started. In step S11, all chips are tested sequentially. Moreover, when testing of all chips on the semiconductor wafer has been completed, testing of the fourth wafer is finished, and a wafer map indicating the results of testing is compiled. The fourth wafer, the testing of which has been completed, is stored in the output cassette OC2 (step S12). In step S13, a judgment is made as to whether or not all wafers stored in the input cassette IC have been tested. In the embodiment, since this is the stage at which testing of the fourth wafer was completed, a judgment is made to the effect that all wafers have still not been tested, the process returns to step S11, and testing of the subsequent wafer is started. Thereafter, the processes of step S11 to step S13 are repeated, and when testing of all 25 wafers has been completed (Yes at step S13), a judgment is made to the effect that testing of all wafers has been completed, the process proceeds to step S14, and testing of all lots is finished.

As described specifically above, the prober 1 of the first embodiment can store separately in the input cassette IC and the output cassette OC1 wafers that remain untested and wafers that have been tested. By taking out the output cassette OC1 from the prober, the wafers that have been tested can be extracted by separating them from the wafers that remain untested. The input cassette IC is not taken out of the prober, and testing can be continued on the wafers that remain untested. Hence, when wafers that have been tested are taken out in advance by separating them from wafers that remain untested, no time or labor is required for setting and aligning the cassette a second time, and the level of throughput can be enhanced.

The prober 1 in the first embodiment includes a step of detecting whether or not the counted number Y of conforming chips coincides with the predetermined number of conforming chips X, and depending on the results of detection, the testing of wafers at that time can be interrupted. Accordingly, in the first place, in the testing of wafers the yield of which is not certain, a lot can be divided automatically on the basis of the result of testing, and the time and labor required for setting and aligning the cassette a second time can be saved. Secondly, testing can be canceled for chips which do not need to be tested. As a result, the level of throughput can be enhanced.

In the case of the prober 1 of the first embodiment, if any untested chip exists on a wafer that has been interrupted, as dummy data, testing results of rejection are assigned to the untested chip. In this manner an untested chip can be prevented from being handled as a conforming chip during a subsequent process.

The prober 1 of the first embodiment has two output cassettes, and depending on the predetermined number of conforming chips X during conditions of testing, the storage destination of wafers that have been tested can be changed over from output cassette OC1 to OC2. Hence, it becomes possible to separate and take out separately wafers that have been initially taken out and tested and wafers that still remain to be tested. As a result, measured data can also be taken out separately, as measured data of wafers that were initially taken out and measured data of the remaining wafers.

The prober 1 of the first embodiment has two output cassettes, OC1 and OC2, and depending on the results of testing, the storage destination of wafers that have been tested can be changed over from output cassette OC1 to OC2. Hence, after a changeover of output cassettes has taken place even if the output cassette OC1 is removed from the prober 1, the testing of wafers is not interrupted, and the level of throughput can be enhanced.

Operations of the prober 1 in embodiment 2 will now be described in detail with reference to the flowchart in FIG. 3. To prepare for testing, one lot of (25) wafers is put into the input cassette IC, and set in the prober 1. After setting of the input cassette IC, alignment and temperature setting are performed.

In step S21, a predetermined number WX of wafers to be divided is registered in advance in the memory of the controller (not shown) of the prober 1 as a condition of testing. The predetermined number WX of wafers to be divided can be set to an arbitrary value. In the embodiment, for example, the predetermined number WX of wafers to be divided is 2. In this embodiment, as described below, 25 wafers stored in the input cassette IC are divided into two parts, 2 wafers and 23 wafers.

When testing is commenced, the number of wafers that have been tested WY is initialized at 0. Testing is started from the first wafer in the input cassette. In step S22, when all chips have been tested, and testing is accordingly completed, the process advances to step S23. In step S23, the number of wafers that have been tested WY is incremented by one (WY=WY+1), and the process progresses to step S24.

In step S24, a judgment is made as to whether or not the number of wafers that have been tested WY is greater than the predetermined number WX of wafers to be divided. If the number of wafers that have been tested WY is smaller than the predetermined number WX of wafers to be divided, the process advances to step S25, and the wafers that have been tested are stored in the output cassette OC1. The process now reverts to step S22, and testing of wafers is continued.

On the other hand, if the number of wafers that have been tested WY is larger than the predetermined number WX of wafers to be divided, the process advances to step S26, and wafers that have been tested are stored in the output cassette OC2. The embodiment covers a case where predetermined number of wafers to be divided WX=2. Hence, the first and second wafers that have been tested are stored in the output cassette OC1, and the third and subsequent wafers that remain to be tested are stored in the output cassette OC2.

With regard to the first and second wafers that are stored in the output cassette OC1, a wafer map illustrating results of testing is compiled, and a wafer map is issued as data for purposes of dividing the lot. In other words, the results of testing of the first two wafers and the results of testing of the third and subsequent wafers are output separately. Hence, the results of testing can be managed separately, respectively in the output cassettes OC1, and OC2. The output cassette OC1, in which division has been completed is removed from the prober 1, and sent to the subsequent process together with data for purposes of dividing the lot.

In step S27, a judgment is made as to whether or not all wafers in the input cassette IC have been tested. In the embodiment, 25 wafers are stored in the input cassette IC. If the number of wafers that have been tested WY is less than 25, a judgment is made that all wafers in the input cassette IC have still not been tested, the process returns to step S22, and the subsequent wafer is tested. When the number of wafers that have been tested WY is 25, a judgment is made that the testing of all wafers has been completed, the process advances to step S28, and testing of the lot completed.

As explained herein, the prober of the second embodiment has two output cassettes, and depending on the predetermined number WX of wafers to be divided which constitutes the conditions for testing, the storage destination of wafers is changed from the output cassette OC1 to OC2. With regard to wafers that have been tested, it is thus possible to distinguish between wafers of a predetermined number that have been set in advance, and that have been tested initially and the rest of the wafers that have been tested. Also on the basis of the predetermined number WX of wafers to be divided, the measured results are also separated. In this manner, measured results can be managed separately in the output cassettes OC1 and OC2.

The invention is not limited to the foregoing embodiments alone, but may be changed or modified within a scope not departing from the true spirit of the invention. In the embodiments, plural chips manufactured on the wafer are tested by the prober 1, but the invention is not limited to such examples. The invention can also be applied to testing of a wafer level package. Testing of a wafer level package is a probing test the land-shape, or ball-shape, terminals provided on the rear surface of a package device. For example, devices are adhered on a flat sheet at equal intervals in the X and Y directions so that the side on which the terminal is positioned becomes the surface side, and so that they can then be probed in the same way as semiconductor wafers.

In the embodiments, testing of wafers is interrupted when the counted number Y of conforming chips reaches a predetermined number of conforming chips X, but the invention is also not limited to this example. The invention can also be applied to a form of testing wafers continuously, even after the number of conforming chips X has been reached, until all chips on the wafer have been tested completely.

In the embodiments, testing of the remaining wafers is continued after the counted number Y of conforming chips reaches the predetermined number of conforming chips X, but the invention is also not limited to this example. The invention can also be applied to a form of standing for testing, or completing testing of a lot, after a notification has been made to the effect that a state has been reached when the counted number Y of conforming chips has reached the predetermined number of conforming chips X.

In the embodiments, the setting number for division of wafers WX is one, and the wafers that have been tested are divided into output cassettes OC1 and OC2. However, the invention is also not limited to this example, a plural number may be set for the setting number for division of wafers WX. In these circumstances, setting the setting number for division of wafers WX to n (n being a natural number), the number of output cassettes is n+1, and wafers can be distributed in n+1 cassettes. For example, when there are two setting numbers for division of wafers WX, 2 and 4, and there are three output cassettes, the first and second wafers are stored in the first output cassette, and the third to sixth wafers are stored in the second output cassette, and the seventh to twenty-fifth wafers are stored in a third output cassette OC3. Thus, it becomes possible for an arbitrary number of wafers to be distributed into three cassettes.

Furthermore, results of testing are issued separately in the output cassettes OC1 and OC2, but the invention is not limited to this example. Results of testing can be issued in the form of the results of the total for output cassettes OC1 and OC2.

In the embodiments, cassettes are used as a storage unit of wafers, but the invention is also not limited to this example, and the prober 1 may also serve as a place for wafers to mark time.

In the embodiments, the storage destination cassettes for wafers that have been tested are changed over on the basis of the predetermined number of conforming chips X or the setting number for division of wafers WX, but the invention need not be limited to these examples. By virtue of taking out from the prober 1 at an arbitrary timing the output cassette designated as a storage destination of wafers that have been tested, the cassette used as a storage destination for wafers that have been tested can be changed over. As a result, if a predetermined number of conforming chips X is not determined, wafers that have been tested can be taken out freely at any time, and the degree of freedom of testing can be enhanced.

Further, in the embodiments, the predetermined number of conforming chips X or the setting number for division of wafers WX, has been used as a condition for testing, but the invention need not be limited to this example. It is also possible to use for this purpose various other conditions such as the operational speed of the semiconductor chips.

In the embodiments, testing results of rejection are assigned to untested chips as dummy data, but the invention is also not limited to such an example. Data may be assigned to the effect that testing has still not taken place. As a result, untested chips can be recognized, and the untested chips can be tested.

Further, the input cassette IC constitutes an example of a first storage unit, output cassettes OC1 and OC2 constitute examples of second storage units, and chips constitute examples of semiconductor devices.

The invention provides a control method and a control program for a prober that are capable of enhancing the level of throughput by eliminating the time required for repeated setting or aligning of the wafer cassettes.

What is claimed is:

1. A control method for a prober that tests a plurality of semiconductor devices manufactured on a semiconductor wafer, comprising:
    taking out from a first storage unit in which a plurality of semiconductor wafers that are to be tested are stored one of semiconductor wafers that is subject to testing, and testing the semiconductor devices on the one of the semiconductor wafers sequentially,
    detecting, during the testing, whether or not results of testing satisfy conditions for testing that have been set in advance, and
    storing in a second storage unit the one of the semiconductor wafers on which the semiconductor device have been tested,
    wherein the taking, the testing and the storing are repeated, and
    in the storing, on the basis of a detection of the conditions by the detecting, the second storage unit in which the semiconductor wafer is stored is exchanged for another storage unit.

2. The control method for a prober according to claim 1, further comprising:
    detecting when results of testing have satisfied conditions for testing that have been set in advance,
    wherein on the basis of the detection testing of the semiconductor wafer is interrupted in midstream.

3. The control method for a prober according to claim 2, wherein the condition for testing is the number of conforming items that pass the testing of the semiconductor devices.

4. The control method for a prober according to claim 2, wherein on the basis of the detection, results of testing the semiconductor wafers stored in the second storage unit are output.

5. The control method for a prober according to claim 1, wherein the second storage unit includes a plurality of storage units.

6. The control method for a prober according to claim 1, wherein the condition for testing is the number of semiconductor wafers that have been tested.

7. The control method for a prober according to claim 1, wherein the condition for testing is the number of conforming items that pass the testing of the semiconductor device.

8. The control method for a prober according to claim 1, wherein on the basis of the detection, results of testing semiconductor wafers stored in the second storage unit are output.

9. A control method for a prober that tests a plurality of semiconductor devices manufactured on a semiconductor wafer, comprising:
    taking out from a first storage unit in which a plurality of semiconductor wafers that are to be tested are stored one of semiconductor wafers that is subject to testing, and testing the semiconductor devices on the one of the semiconductor wafers sequentially,
    detecting, during the testing, whether or not results of testing satisfy conditions for testing that have been set in advance, and
    storing in a second storage unit the one of the semiconductor wafers on which the semiconductor device have been tested,
    wherein the taking, the testing and the storing are repeated,
    on the basis of a detection by the detecting, testing of the semiconductor device on the one of the semiconductor wafers is interrupted in midstream, and
    upon semiconductor devices are becoming present on the semiconductor wafer that remained untested at a time that the testing was interrupted, dummy test results are assigned to the semiconductor devices that remain untested.

10. A tangible computer readable medium having computer-executable instructions adapted thereon that, when executed by a processor, perform a method for a prober for testing a plurality of semiconductor devices manufactured on a semiconductor wafer, the method comprising:
    taking out from a first storage unit in which a plurality of semiconductor wafers that are to be tested are stored one of semiconductor wafers that is subject to testing, and testing the semiconductor devices on the one of the semiconductor wafers sequentially,
    detecting, during the testing, whether or not results of testing satisfy conditions for testing that have been set in advance, and
    storing in a second storage unit the one of the semiconductor wafers on which the semiconductor devices have been tested,
    wherein the taking, the testing and the storing are repeated, and
    in the storing, on the basis of a detection of the conditions by the detecting, the second storage unit in which the semiconductor wafer is stored is exchanged for another storage unit.

* * * * *